United States Patent [19]
Chatel et al.

[11] Patent Number: 5,428,507
[45] Date of Patent: Jun. 27, 1995

[54] FRONT PANELS FOR RACK-MOUNTED PRINTED CIRCUIT BOARDS

[75] Inventors: Louis R. Chatel, The Foot of Crosby St., Lowell, Mass. 01852; Stephen E. O'Neal, Southeast Huntsville, Ala.

[73] Assignee: Louis R. Chatel, Middlesex County, Mass.

[21] Appl. No.: 231,617

[22] Filed: Apr. 22, 1994

[51] Int. Cl.6 .............................................. H05K 7/14
[52] U.S. Cl. .................................... 361/798; 361/740; 361/754; 361/759; 361/801
[58] Field of Search .............................. 361/725–727, 361/732, 740, 754–755, 759, 798, 801; 439/152–153, 155, 157, 160; 211/41; 403/16, 321, 330

[56] References Cited

U.S. PATENT DOCUMENTS

| | | | |
|---|---|---|---|
| 3,311,863 | 3/1967 | Beale | 361/798 |
| 4,197,572 | 4/1980 | Aimar . | |
| 4,445,740 | 5/1984 | Wallace . | |
| 4,525,771 | 6/1985 | Hanseler et al. . | |
| 4,632,588 | 12/1986 | Fitzpatrick | 361/759 |
| 4,648,009 | 3/1987 | Beun et al. . | |
| 4,947,289 | 8/1990 | Dynie . | |
| 4,996,631 | 2/1991 | Freehauf . | |
| 5,140,501 | 8/1992 | Takahashi et al. . | |
| 5,216,578 | 6/1993 | Zenitani et al. . | |
| 5,309,325 | 5/1994 | Dreher et al. | 361/754 |

*Primary Examiner*—Bot L. Ledynh
*Attorney, Agent, or Firm*—Pearson & Pearson

[57] ABSTRACT

A front panel for mounting a printed circuit board in a card cage. A central frame is formed with an integral extrusion from which integral printed circuit board mounting brackets can be formed on one surface of the central frame. Ejector assemblies mount at each end of the central frame and include an extruded mounting bracket that attaches to the central frame, an extruded ejection handle with legs that straddle the mounting frame and a solid handle portion with a pivot that mounts to a solid pin captured in the assembled structure. Rotating the extraction handle causes the legs to bear against the card cage and fully extract the printed circuit board from a back plane. When adjacent printed circuit boards are fully seated, the extraction handles align parallel the central plane and can support identifying labels in a clear and secure fashion.

10 Claims, 3 Drawing Sheets

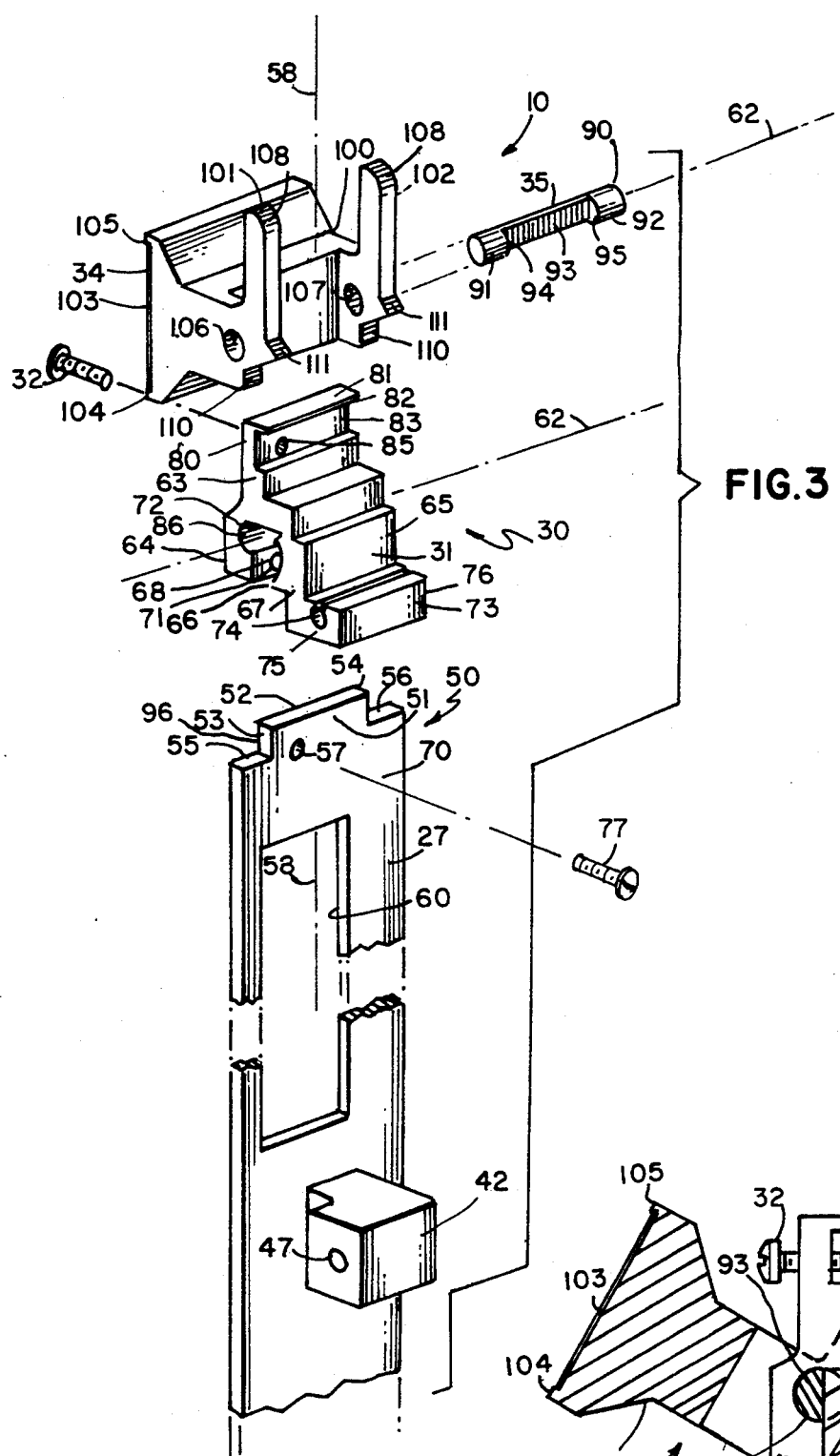
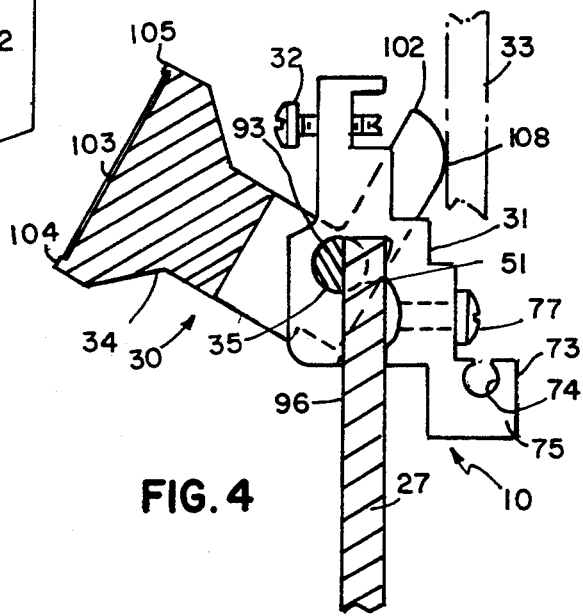
FIG. 3
FIG. 4

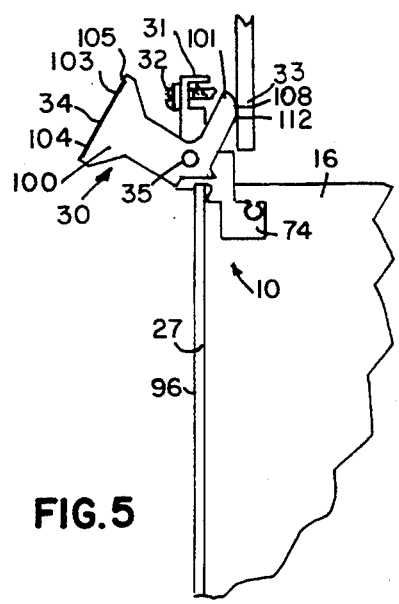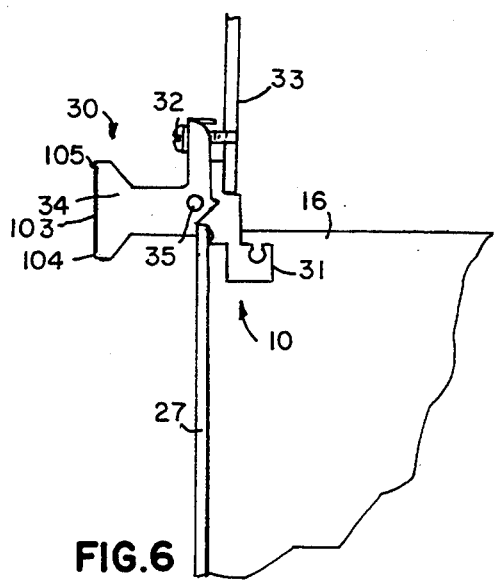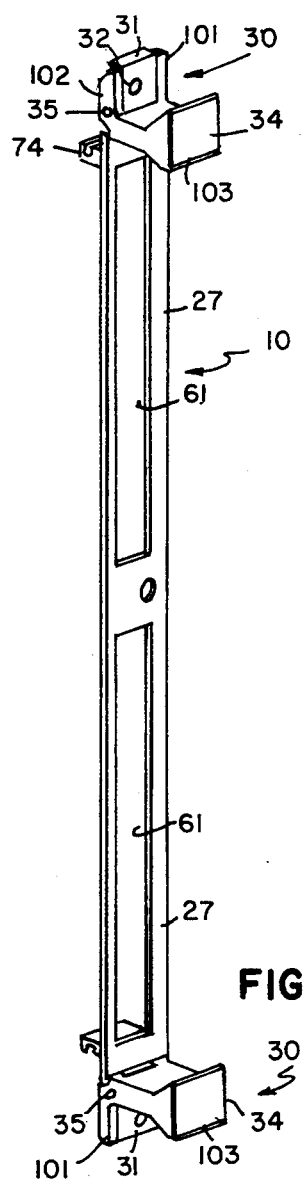

FRONT PANELS FOR RACK-MOUNTED PRINTED CIRCUIT BOARDS

BACKGROUND OF THE INVENTION

1. Field of the Invention

This invention generally relates to card cages and other housings for supporting printed circuit boards in electronic equipment and more specifically to front panels useful in the insertion and extraction of printed circuit boards from such card cages and housings.

2. Description of Related Art

Card cages are a form of housing for supporting printed circuit boards in compact or dense configurations. They generally comprise an open framework with a top, bottom, back and sides. Front support rails define an open front through which the printed circuit boards are inserted into the card cage. The back typically supports a backplane with backplane connectors for receiving mating connectors on a rear edge of each printed circuit board. Rails attached to the top and bottom or to the sides or intermediate locations generally engage parallel edges of the printed circuit board (i) to guide the printed circuit board into the card cage in either a vertical or horizontal orientation, (ii) to align the printed circuit board connector with a corresponding backplane connector and (iii) to support the printed circuit board after it is seated in the card cage.

Oftentimes it is desirable to lock the printed circuit board in place. In some situations apparatus as simple as a machine screw that leads through a lead hole in a front panel and threads into a front support rail provides this locking function. In other situations it is desirable to provide a ready means for removing or extracting a printed circuit board from the card cage for maintenance, upgrade or other purposes and for then reinserting the same or another printed circuit board into the card cage. Diverse front panel and other structures have evolved for facilitating such insertion and extraction operations. For example, in U.S. Pat. Nos. 4,525,771 and 5,216,529 specially formed structures and card cages position printed circuit boards in the card cages.

U.S. Pat. No. 4,525,771 of Hänseler et al. discloses a modular assembly in the form of a card cage with guide rails that receive parallel edges of a printed circuit board. Each printed circuit board has a front panel. Nose members at the ends of each front panel fit into grooves formed in the leading edges of top and bottom transverse rails. A latching device at the rear edge of each printed circuit board engages a metal strip at the backplane. A rail-like securing member provides elastic shock absorbing fastening. This securing member overlies all the front panels and attaches to the side walls of the card cage. Transverse shock absorbing profiled sectional members between the side walls lock the front panels in place.

U.S. Pat. No. 5,216,578 to Zenitani et al. discloses a printed circuit board holding structure with a pair of linear guide members that attach to the edges of the printed circuit board and a pair of support members for receiving the respective guide members. The support members cantilever from a backplane and carry backplane connectors that receive mating printed circuit board connectors. The housing has positioning apertures to be fitted to contact pins projected from the backplane.

U.S. Pat. Nos. 4,648,009; 4,947,289; 4,996,631 and 5,140,501 depict other front panel embodiments. These front panels are adapted for inserting and extracting printed circuit boards from standard card cages.

U.S. Pat. No. 4,648,009 to Beun et al. discloses an articulated latch for use with the printed circuit board. The latch comprises an actuating member pivotally secured to a latching member. The latching member attaches to a base plate on a printed circuit board. The actuating and latching members have an interface mechanism comprising a cooperating tab, slots and wells for allowing the actuating member to lock to the latching member in at least two positions. The actuating member stores in approximately a horizontal position when the printed circuit board is fully inserted in a card cage.

U.S. Pat. No. 4,947,289 to Dynie discloses a latch mechanism for a plug-in cartridge that comprises a body portion, a pair of walls extending from the body portion, a camming portion and an actuating portion. The walls have apertures that are snap locatable into detents on a specially constructed face plate thereby resiliently latching the latching mechanism when a printed circuit board is fully inserted into a cabinet. The camming portion projects from the latching mechanism and cooperates with the actuating portion to function as a lever, the camming portion being engageable with an inside surface of a mating apparatus to establish a first engagement about which the latching mechanism is levered to overcome an insertion force. The camming portion also can engage an outside surface of the mating apparatus to establish a second engagement about which the latching mechanism is levered to overcome an extraction force. When the latching mechanism is in a latched position, it is flush with a face plate. Extraction requires the actuating portion to be levered out from the face plate by a blade or the like.

U.S. Pat. No. 4,996,631 to Freehauf discloses a circuit board injector-ejector system with a lever handle that mounts for rotation on an exterior corner of the circuit board. The lever handle extends out and through an opening formed in a front panel. Selective rotation of the lever handle inserts or extracts the circuit board with only one of a pair of finger extensions located on the lever arm being cooperatively engaged with the printed circuit board, depending upon the direction of lever handle rotation.

U.S. Pat. No. 5,140,501 to Takahashi et al. discloses a mechanism for inserting and withdrawing a printed circuit board from a card cage. A lockarm with a flexible tip and a base portion attaches to the printed circuit board. A lever pivots on the printed circuit board and has a cam surface that drives the lock arm for inserting and extracting of the printed circuit board into and from the card cage. An aperture formed at the bottom of the card cage engages the lock arm when the printed circuit board is fully inserted. The lever thereby indicates, by its angular position, whether the printed circuit board is inserted fully.

Other front panel embodiments have also become commercially available for positioning printed circuit boards in card cages. For example, Electronics Solutions, of San Diego, Calif. provides a front panel with brackets that mount the front panel to the printed circuit board. A handle having a cam portion extends through a slot in the front panel and pivots on the printed circuit board. The cam portion is intermediate the pivot point and the handle so it can bear against a support rail and partially eject an attached printed circuit board from the backplane connector.

Schorff, Incorporated, of Warwick, R.I. provides a similar front panel that includes a central panel portion, upper and lower hinges, and handles for connection to the hinges. The front panel attaches to the hinges that in turn, bolt to printed circuit board. Each handle provides a double camming surface that straddles the hinge and apparently is held in place by a standard pin. Each hinge also carries a screw for mounting the hinge to the card cage. In this particular embodiment, the handle has a finger pad or flat surface that extends at right angles to the panel and not parallel to the panel, as is the industry preference. It also appears that as the circuit board is inserted, the lower handle can assume an orientation that can block the insertion process.

As each of these and other front panels have been developed, a series of desirable features and characteristics have evolved. For example, during extraction, the front panel should completely disengage the backplane and printed circuit board connectors. The ejection mechanism should not overlap any significant portions of the printed circuit board. The forces required to eject the board should transfer to the printed circuit board evenly and the printed circuit board should move in its plane without bending. The front panel should be rugged and reliable in use and should be readily adapted for use as connectors with a variety of printed circuit boards at different locations. The operative handle should reliably hold labels. Moreover, the label surface should parallel the front panel plane when the printed circuit board is fully inserted in the card cage. The label surfaces on adjacent front panels should remain aligned to facilitate identification and provide a pleasing appearance. In addition these assemblies should reduce inventory requirements and be manufactured at minimal cost.

None of the prior art front panels satisfy all of these requirements. For example, the commercially available panel structures generally have injection molded plastic handles. Some handles provide no structure for a label. Generally they all wear with use and are subject to misalignment. In many of these assemblies the forces required to remove the printed circuit board are not transferred uniformly to the printed circuit board, particularly front panels using a single cam. In other panels, as shown in the foregoing patents, the insertion/ejection operation may overlap large portions of the printed circuit board and limit the area available for circuitry. Some panels require external tools. Others require overly complicated manipulation during the insertion or extraction process.

SUMMARY

Therefore it is an object of this invention to provide a printed circuit board front panel for use in a card cage that completely disengages backplane and printed circuit board connectors during extraction, that maximizes the area of the printed circuit board available for circuits, that evenly applies extraction forces to the printed circuit board evenly and that moves the printed circuit board in its plane.

Another object of this invention is to provide a printed circuit board front panel for use in a card cage that completely disengages backplane and printed circuit board connects upon ejection, that is rugged and that maintains the extraction handles in a predetermined position, even after repeated use.

Still another object of this invention is to provide a printed circuit board front panel for use in a card cage that is rugged, that distributes extraction forces evenly through the printed circuit board and that enables flexibility in locating sites at which the printed circuit board attaches to the front panel.

In accordance with one aspect of this invention, a front panel for inserting and extracting a printed circuit board with respect to a card cage, that includes spaced support rails and a backplane connector, comprises an elongated central frame and an extractor assembly at either end of the central frame. The elongated central frame is extruded with a planar body portion with a tab end extending from each end thereof. Each extractor assembly attaches to each tab end of the planar body portion and includes a card cage mounting bracket that attaches to the card cage, an extraction handle and a pivot. The card cage mounting bracket is extruded and overlies the central frame tab end and is affixed to the central body portion. Each extraction handle is extruded with a body portion that enables the actuation of said extraction handle and with spaced legs that extend at substantially right angles from said body portion and straddle the mounting bracket. The pivot attaches to the mounting bracket and the extraction handle for enabling the extraction handle to pivot relative to the mounting bracket. The extraction handle body portion has a planar surface that parallels the central body portion when said leg means are aligned with and extend away from said central body portion.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

FIG. 3 is an exploded view in perspective of a portion of the front panel in FIG. 1;

FIG. 4 is a section of one portion of a panel taken along lines 4—4 in FIG. 1;

FIG. 5 is a side view of a front panel after it is extracted from its card cage in FIG. 1;

FIG. 6 is a side view of a front panel when it is inserted fully in the card cage of FIG. 1; and FIG. 7 is a perspective view of a complete front panel.

DESCRIPTION OF ILLUSTRATIVE EMBODIMENTS

Figure 1:
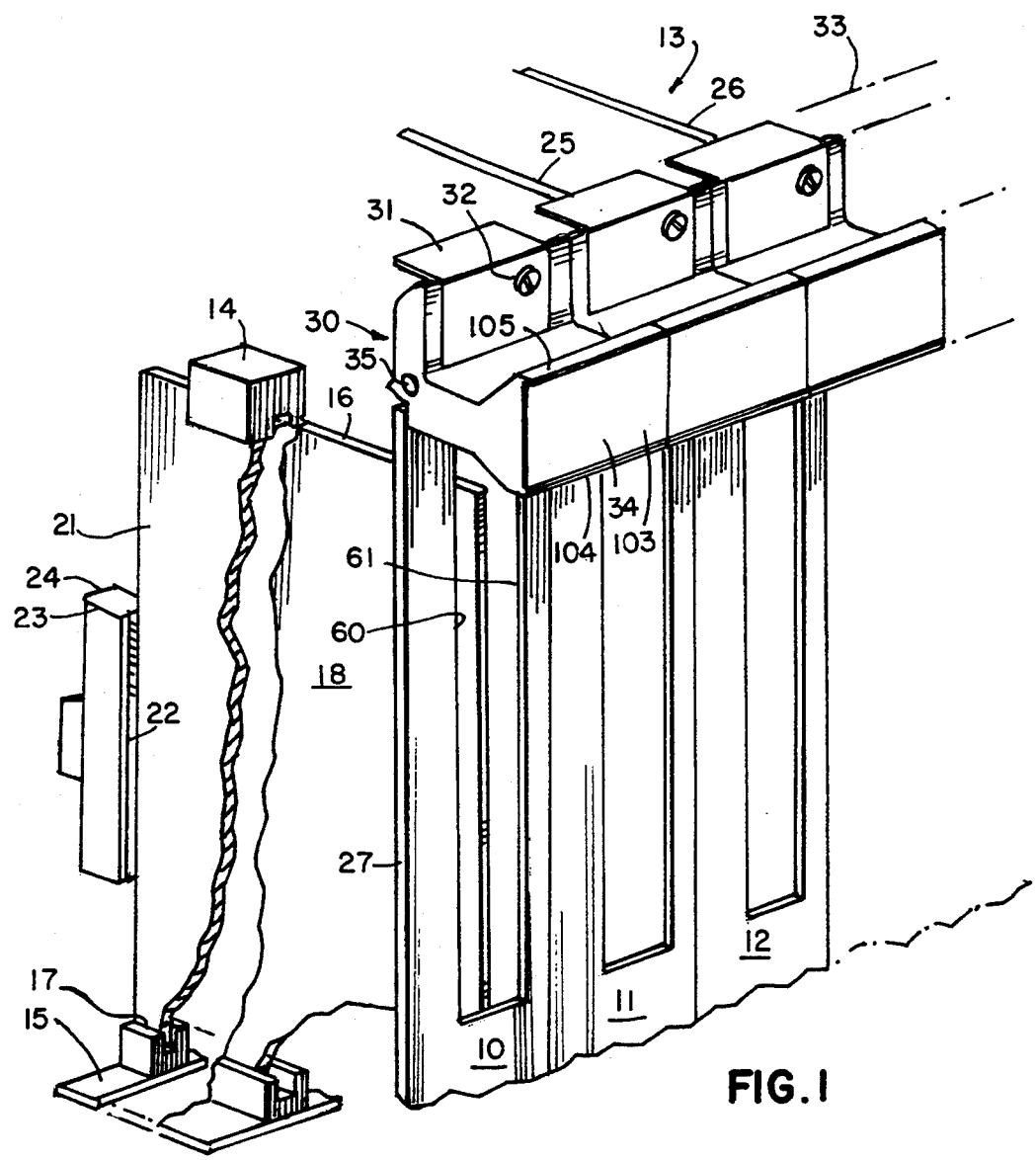
FIG. 1 is a perspective view of a portion of a card cage with front panels constructed in accordance with this invention.

FIG. 1 discloses three front panels 10, 11 and 12 mounted in a conventional card cage 13. The card cage 13 includes certain elements for each position of one of the panels 10, 11, and others. For the front panel 10, an upper guide rail 14 and a lower guide rail 15 engage side edges 16 and 17 of a printed circuit board 18 attached to the panel 10. A rear edge 21 of the printed circuit board 18 ends in a connector 22 that in turn mates with a backplane connector 23 attached to a back plane 24 of the card cage 13. The front panel 10 attaches to the printed circuit board 18 as described later. Printed circuit boards 25 and 26 attach to front panels 11 and 12 respectively, and the card cage 13 includes, for each front panel, guide rails, connectors and other components that are analogous to those associated with the front panel 10.

FIG. 1 depicts portions of an upper half of the card cage 13 only. The upper and lower halves are symmetrical and so the following explanation of the upper half will suffice for explaining the construction and operation of the symmetrical lower half. In addition the following description is given in terms of vertically oriented circuit boards. It will become apparent that this invention is useful with front panels arranged to be installed vertically or horizontally or in other orientations.

Still referring to FIG. 1 and particularly to the front panel 10 by way of explanation, an elongated central frame 27 carries an extractor system assembly 30 at the upper end of the central frame 27 and corresponding extractor assembly 30 at its bottom edge, as shown in FIG. 7. The extractor assembly 30 includes a mounting bracket 31 with a machine screw 32 for attaching the mounting bracket 31 to an upper front rail 33 associated with the card cage 13. The extractor assembly 30 additionally includes an extraction handle 34 that pivots about a pin 35 carried through a pivot point of the extraction handle 34 and a portion of the mounting bracket 31.

Figure 2:
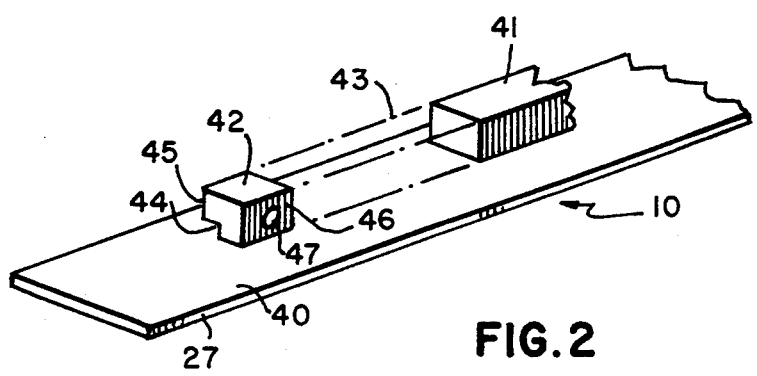
FIG. 2 is a perspective of one portion of a front panel shown in FIG. 1.

Referring now to FIG. 2, the central frame 27 for a front panel such as the front panel 10 is extruded in a T-shape with a planar body portion 40 and a centrally extending leg 41 having either a rectangular cross-section or other required shape. The rectangular leg 41 is coextensive with the entire length of the central body portion 40 after the extrusion. If a particular application requires printed circuit board mounts intermediate the mounting brackets 31, these are formed from the leg 41. Specifically, portions of the leg 41 adjacent a mounting location are removed by machining. This leaves a printed circuit board mount 42 that is isolated from any other portion, the removed portions being indicated by the phantom section 43.

If only one such printed circuit board mount is required, all remaining portions of the leg 41 will be removed from the body portion 40. At each printed circuit board mount additional machining may produce an undercut 44 thereby to provide a relieved section of face 45. The leg 41 may be on center, or be cut to provide offset faces 45 and 46 to which a printed circuit board can attach. An aperture 47 between the faces 45 and 46 can be prethreaded or formed for self tapping thereby to allow a machine screw led through the printed circuit board to secure the printed circuit board to the mount 42 against either the face 45 or the face 46.

Referring now to FIG. 3, the central frame 27 in this embodiment has a centrally located printed circuit board mount 42. It also terminates at an end 50 with a tab 51 that has a free edge 52 and side edges 53 and 54. The side edges 53 and 54 also intersect transverse edges 55 and 56 respectively. A threaded aperture 57 extends through the central frame 27 and, in this case, is centered along a line between the transverse edges 55 and 56 and is offset from a vertical center axis 58.

In this particular embodiment, additional machining has produced a window 60 through the front panel as shown in FIGS. 1 and 3. Such windows allow direct viewing of a front edge 61 of a printed circuit board and any indicators that might be located along that front edge 61. Such a window might also be filled with a closing panel.

Thus, as shown in FIGS. 1 through 3, the central frame 27 has a planar body portion 40 with a tab end, such as the tab end 51 at each end of the central frame 27. Side edges 53 and 55 extend from the planar body portion 40, and the free edge 52 extends the side edges 53 and 54. The central body portion 40 additionally includes at least an integrally extruded printed circuit board mount 42 extending from the planar body portion 40.

Now referring to FIG. 3, the mounting bracket 31 comprises an extrusion formed along an axis 62 with a central body portion 63 and two spaced depending leg sections 64 and 65 that define an intermediate access slot 66. The surface of the leg 65 facing the slot 66 may include a first standoff 67 at the slot opening and a second standoff 68 that define a support plane for engaging a front surface 70 of the central frame 27. The slot has a total depth that aligns apertures 71 and 57 when the free edge 52 of the tab end 51 abuts an end surface 72 of the slot 66.

The free end of the leg 65 includes an integrally extruded printed circuit board mounting bracket 73 having a partially closed slot 74 formed therein parallel to the axis 62. This slot, like the aperture 47 at the printed circuit board mounting block 42, can be prethreaded or sized to allow a self tapping screw to firmly connect and lock a printed circuit board to an end face 75 or an end face 76. As the brackets 31 are cut from a long extrusion, the location of the apertures 57 and 72 and the relative positions of faces 75 and 76 allow the bracket to mount accurately on the tab end 70 such that corresponding end faces of the mounting brackets 74 and 42 lie in a plane.

A machine screw 77 passes through the aperture 71 and threads into the aperture 57 thereby to affix the structure to the free end. The aperture 71 may also extend into the leg 67 so the machine screw 77 can extend through and slightly beyond the central frame 27.

A leg 80 parallel to the axis 60 and a transverse leg 81 formed with the mounting bracket 31 terminate with an edge 82 in the same plane as a surface 83 thereby to define a support plane that bears against a support rail of the card cage, such as the support rail 33 shown in FIG. 1. A machine screw 32, typically with a reduced shank area threads through a threaded aperture 85 in the leg 80 and then can thread through a corresponding threaded aperture in the support rail 33 shown in FIG. 1.

The slot 66 terminates at the body portion 63 in a semi-circular, side-facing notch 86 that receives the pin 35. In accordance with another aspect of this invention, the pivot pin 35 has cylindrical end portions 91 and 92 and a central flat portion 93. The central flat portion 93 extends between the end portions 91 and 92 for a distance corresponding to the distance between the edges 53 and 54 of the tab end 51. Radially extending surfaces 94 and 95 formed at the ends of the flat 93 engage the edges 53 and 54 while the flat 93 engages a surface 96 of the tab end 51. Thus when the pivot pin 35 is located in the slot 68 and the flat 93 aligns with the leg 64, the pivot pin 35 and the mounting bracket 31 can slide over the tab end 51 thereby locking the pivot pin 35 in position against the central frame 27.

Still referring to FIG. 3, the extraction handle 34 is extruded along a line parallel to the axis 62. This extrusion has a solid body portion 100 with a portion being machined to form two spaced depending legs 101 and 102. The legs 101 and 102 straddle the mounting bracket 31 and the total width of the extraction handle 34 corresponds to the width of the central frame 27. The solid body portion 100 terminates in a continuous label support surface 103 that may include top and bottom border edges 104 and 105. Aligned apertures 106 and 107 receive the end sections 91 and 92 of the pin 35.

During assembly, the extractor handle 34 is positioned on the mounting bracket 31 to enable the pivot pin 35 to be inserted through the apertures 104 and 105 in the extraction handle 34 and the semi-circular area 86 in the mounting bracket 31. The pin 35 is oriented so the flat 93 aligns vertically as shown in FIG. 3. This subassembly can then be installed on the tab end 52 and locked in place by means of the machine screw 76. With this structure the pivot pin 35 is fixed in place. It is impossible for the pivot pin 35 to move axially along its axis and loosen. As the legs 101 and 102 further straddle the bracket 91 the extraction handle 34 can not detach from the pivot pin 35. Moreover by constructing a relative large pin 35 and extruding the extraction handle 34 from aluminum or similar metal, repeated pivoting action of the extractor handle 34 will not produce significant wear.

Still referring to FIG. 3, each of the legs 101 and 102 extends essentially parallel to the surface 103 and, in the orientation shown in FIG. 3, outwardly from the tab end 51. The legs 101 and 102 have camming surface 108 and, adjacent the apertures 106 and 107, first and second stops 110 and 111. The stops 110 engage the front surface 70 of the central frame 27 and thereby limit angular rotation in the counterclockwise direction as shown in FIG. 3. The other stops 111 limit clockwise rotation when they engage the upper edges 55 and 56 at the tab end 51. This feature, in combination with the camming surfaces 107 formed on the legs prevents a locked condition from existing, as described later.

FIG. 4 more clearly depicts the structure at each end of the central frame member 27. The extruded metallic card cage mounting bracket 31 rests on the tab end 51 of the central frame 27. The pivot pin 35, particularly the central flat portion 93, is captured in the notch 86 and against the surface 96. The machine screw 77 taps into the central plate 27 to affix the bracket 31 and the captured pivot pin 35 and extraction handle 34. The extraction handle 34 is therefore free to pivot between a fully clockwise position as shown in FIGS. 3, 4 and 5 and a counterclockwise position as shown in FIG. 6. The machine screw 32 provides a structure for attaching the mounting bracket 31 to the card cage. The printed circuit board mount 74 provides a structure for attaching the edge of a printed circuit board to the bracket 31. In the orientation shown in FIG. 4, the legs, including the leg 102 have rotated fully clockwise and have displaced, the bracket 31 and front panel 10 from the card cage support rail 33 shown in phantom.

FIG. 5 is a side view of the front panel 10 and, in phantom, its associated printed circuit board 16 and support rail 33. In this particular embodiment, the printed circuit board 16 connects to the printed circuit board mounting bracket 74 at the mounting bracket 31 and at a corresponding position at the other ends of the central frame 27. The front panel 10 is in a position either after extraction or prior to seating the terminal connector 22 in the back plane connector 23.

In some prior art devices the insertion force can act through the extractor member and the pivot axis. Consequently the insertion force would not pivot the bottom extraction handle, and the extraction handle would block insertion unless it was rotated by an individual. In accordance with this invention, and as shown in FIG. 5, the insertion force acts through a contact point 112 that is spaced from the pivot pin 35. The force therefore produces a counterclockwise moment that pivots the handle 34 from the position shown in FIG. 5 at the beginning of the insertion process to the position shown in FIG. 6 when the front panel 27 and printed circuit board 16 are fully seated. This action occurs particularly as the bottom extraction handle. As will be apparent from FIG. 6, when the printed circuit board is fully seated, the machine screw 32 can be tightened in the support rail 33 thereby to permanently affix the front panel 10 to the card cage.

Extraction of a printed circuit board merely requires removal of the machine screws, such as machine screw 32, at each extractor assembly 30. An individual then pivots the top and bottom extraction handles 34 to positions corresponding to the position shown in FIG. 5. More specifically an individual can grasp each extraction handle 34 along the border edges 104 or can push on the surface 103. As the extractor handles 34 pivot from the position shown in FIG. 6 to the position shown in FIG. 5, the legs 101 and 102 engage the support rail 33 and the corresponding support rail at the bottom of the front panel 10. The extraction force then transfers through the extraction handle 34, the pivot pin 35, the mounting bracket 31, the center frame 27 to the printed circuit board and displaces the printed circuit board in its plane.

As will now be apparent from FIGS. 1 through 7, the integrally extruded central frame 27 is adapted to a wide variety of applications. In applications where the printed circuit board mounting brackets 31 provide sufficient support the entire block 41 in FIG. 2 will be removed. If wider printed circuit boards require one or more intermediate mounting brackets like the mount 42 the machining process is readily adapted to produce such mounts as integral members that do not require any mounting hardware. Such additional printed circuit board mounts are easily formed adjacent the internal corners of half circuit boards that might be mounted to a single front panel 10.

The solid body portion 100 of the extraction handle 34 provides a continuous surface 103 for supporting any label that may be affixed to the extraction handles. The use of the pin 32 and the structure of the extraction handle 34 assure that, as shown in FIG. 1, the border edges 104 and 105 on adjacent extraction handles align when all the printed circuit boards are fully seated thereby providing an aesthetically pleasing appearance. Moreover, the surface 103 is parallel to the plane of the front panels, so any label mounted thereon is visible. The legs 101 and 102 extend for a sufficient distance from the pivot pin to assure that in a fully extracted position as shown in FIG. 5 the center frame 27 has withdrawn the printed circuit board 16 fully such that the terminal connector 22 and back plane connector 23 completely disengage. This extraction is controlled, and it is not necessary for an individual to apply further extraction force to overcome the friction that otherwise would exist between the connector members if full extraction did not occur. The use of the integral mounting blocks and supporting printed circuit board structures, and the locking nature of the pivot pins 32 assure that the front panel operates reliably and repeatably with extended use. Consequently, it will now become apparent that the disclosed front panel 10 of FIGS. 1 through 7 with its extractor assemblies 30 attains all the desirable features for a front panel assembly.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. A front panel for inserting and extracting a printed circuit board with respect to a card cage with spaced support rails and a backplane connector for engaging, respectively, the sides of and a mating connector at the rear of the printed circuit board, said front panel comprising:
   A. an elongated extruded central frame having a planar body portion with a tab end extending from each end thereof and at least one integrally extruded printed circuit board mount extending therefrom, and
   B. an extractor assembly for attachment to each tab end of the planar body portion, each said extractor assembly including:
      i. an extruded card cage mounting bracket overlying said tab end and being affixed to said planar body portion,
      ii. means for attaching said mounting bracket to the card cage,
      iii. an extruded ejection handle having a body portion that enables the actuation of said ejection handle and having spaced leg means extending a substantially right angles from said body portion for engaging the card cage and straddling said mounting bracket, and
      iv. pivot means attached to said mounting bracket and said ejection handle for enabling said ejection handle to pivot relative to said mounting bracket, said pivot means being transverse to said tab end, and said body portion of said ejection handle having a planar surface that parallels said planar body portion when said leg means are aligned with and extend away from said planar body portion.

2. A front panel as recited in claim 1 wherein each said tab end has side edges extending from said planar body portion and a free edge between said side edges and said pivot means has end portions and a central flat portion for engaging a planar surface of said tab end proximate said free edge, said end portions engaging said side edges thereby to capture said pivot means in said extractor assembly.

3. A front panel as recited in claim 2 wherein said central flat portion is coextensive with said mounting bracket and said tab end and wherein said end portions engage said leg means.

4. A front panel as recited in claim 1 wherein said mounting bracket additionally has an integrally extruded printed circuit board mount for attachment to a front edge of a printed circuit board.

5. A front panel as recited in claim 4 wherein each said printed circuit board mount includes an extruded opening and wherein a machine screw engages said opening to mount a printed circuit board to each said printed circuit board mount.

6. A front panel as recited in claim 1 wherein each said ejection handle has formed thereon, proximate said pivot means, first and second stop surfaces for engaging said central frame thereby to limit the rotation of said ejection handle relative to said front panel.

7. A front panel as recited in claim 1 wherein each of said leg means includes edges formed as cam surfaces for engaging the card cage whereby the card cage drives said leg means during insertion thereby to position said planar surface of said ejection handle parallel to said planar body portion of said central frame when the printed circuit board is fully seated in the card cage.

8. A front panel as recited in claim 7 adapted for having a label attached to said ejection planar surface on said handle said planar surface being continuous thereby to fully support a label attached thereto and to display the label when the printed circuit board is fully seated in the card cage.

9. A front panel for displaying a label and for inserting and extracting a printed circuit board with respect to a card cage with spaced support rails and a backplane connector for engaging, respectively, the sides of and a mating connector at the rear of the printed circuit board, said front panel comprising:
   A. an elongated extruded central frame having a planar body portion with a tab end extending from each end thereof, each said tab end having side edges extending from said planar body portion and a free edge between said side edges, and
   B. an extractor assembly for attachment to each tab end of the planar body portion, each said extractor assembly including:
      i. an extruded card cage mounting bracket overlying said tab end and being affixed to said planar body portion, said mounting bracket having an integrally extruded printed circuit board mount with an opening therethrough,
      ii. means for attaching said mounting bracket to the card cage,
      iii. an extruded ejection handle having a body portion and spaced legs that straddle said mounting bracket, said body portion having a continuous planar surface for supporting a label and each of said legs extends at substantially right angles from said body portion for engaging the card cage and includes first and second stop surfaces for engaging said central frame thereby to limit the rotation of said ejection handle relative to said front panel, each said leg additionally including an edge formed as a cam surface for engaging the card cage,
      iv. a pivot pin having end portions and a central flat portion coextensive with said mounting bracket and said tab end for engaging a planar surface of said tab end proximate said free edge, said end portions engaging said side edges thereby to capture said pivot pin in said extractor assembly and engaging pivots formed in said legs whereby said ejection handle pivots relative to said mounting bracket between positions established by said first and second stop surfaces, and
      v. a machine screw for mounting a printed circuit board to each said printed circuit board mount by engaging the printed circuit board and said circuit board mount opening, whereby the card cage drives said legs during insertion thereby to position said planar surface on said ejection handle and a label thereon parallel to said planar body portion of said central frame when the printed circuit board is fully seated in the card cage.

10. A front panel as recited in claim 9 wherein said central frame planar body portion additionally includes at least one integrally extruded printed circuit board mount extending from said planar body portion.

* * * * *